United States Patent [19]
Burke

[11] Patent Number: 4,875,003
[45] Date of Patent: Oct. 17, 1989

[54] NON-CONTACT I/O SIGNAL PAD SCAN TESTING OF VLSI CIRCUITS

[75] Inventor: Gary R. Burke, Encinitas, Calif.

[73] Assignee: Silicon Connections Corporation, San Diego, Calif.

[21] Appl. No.: 314,510

[22] Filed: Feb. 21, 1989

[51] Int. Cl.$^4$ ............................................. G01R 31/28
[52] U.S. Cl. ................................. 324/73 R; 371/25.1
[58] Field of Search ............ 324/73 R, 73 AT, 738 C; 371/25

[56] References Cited

U.S. PATENT DOCUMENTS 4,791,358 12/1988 Sauerwalp et al. ............... 324/73 R

OTHER PUBLICATIONS

IEEE article reprinted from the Proceedings of the Fourtheenth Design Automation Conference, 1977, pp. 462–468, copyright 1977 by IEEE.

Primary Examiner—Ernest F. Karlsen
Assistant Examiner—Edward Urban
Attorney, Agent, or Firm—Baker, Maxham, Jester & Meador

[57] ABSTRACT

In a microcircuit employing LSSD boundary scanning, input and output cells of the circuit are tested using the LSSD boundary scan circuity. Input cells of the circuit are tested by applying two voltages alternately to input cell signal pads and capturing and shifting out through input boundary scan circuitry the responses of the input cells to the voltages. Output cells are tested by shifting a predetermined test pattern through the output boundary scan circuitry. The pattern encloses a set of significant bits which is applied sequentially to the output cells. Each output cell has a gated signal path connecting its signal pad to an internal signal conductor which conducts the response of the output cell to an internal signal path as the significant bits of the bit pattern are scanned past the cell.

5 Claims, 3 Drawing Sheets

NON-CONTACT I/O SIGNAL PAD SCAN TESTING OF VLSI CIRCUITS

BACKGROUND OF THE INVENTION

The invention is in the field of VLSIC microcircuits, and particularly concerns the use of shift register latches (SRL's) to test and evaluate the circuitry in a VLSI micro circuit. In particular, this invention relates to the use of boundary scanning registers which are integrated into the structure of a microcircuit for the purpose of scan-testing the input and output cells of the microcircuit.

During the commercial production of integrated circuits, some defective devices are unavoidably produced. These need to be identified and sorted out so that only the good devices are mounted in physical supports such as dual in-line packages. After the wafer fabrication is completed, each finished wafer undergoes a wafer-sort process where each die on the wafer is electrically tested using miniaturized probes that touch contact pads formed on the die.

With the advent of VLSIC's having large numbers of pads, it has become impractical to contact each and every pad. Therefore, boundary scan methods such as LSSD have been used to apply input signals or stimulus, and to read the output signals, using a small subset of the available pads. However, such methods do not test the part of an integrated circuit which is outside of the boundary scan, namely, the input and output pads and the input and output buffers. Boundary scan methods could be extended to include this circuitry, but this results in several disadvantages. The test signal levels are different and thus translator circuits are required, which add cost and consume die area. These translator circuits must be disabled during normal operation of the integrated circuit, and this requires additional circuitry. Other approaches involve additional scan paths which require considerably more logic. Also, existing pad scan methods do not measure DC threshold and output levels.

The use of level sensitive scan design (LSSD) in the operation and testing of VLSI microcircuits is well-known. See, for example, the article "A Logic Design Structure for LSI Testability" by Eichelberger et al, which appeared in the PROCEEDINGS of the 14th Design Automation Conference, 1977, at pages 462–468.

FIG. 1 illustrates a prior art implementation of LSSD to support efficient testing and maintenance of a microcircuit chip 10. The chip 10 includes VLSI logic which is generally centered in the chip 10 and recessed from its four edges. Input signals are provided to the logic 12 through a plurality of input cells 14. The outputs of the logic 12 are provided through a plurality of output cells 16. Interposed between the input cells and the logic 12 are a plurality of input shift register latches 18 (SRL's). A plurality of output SRL's 12 is provided between the ouput of the chip logic 12 and the output cell 16. The input SRL's 18 are each connected to receive an input signal from a respective one of the input cells 14 for registration of an input signal conducted into the chip 10 through the cell. Once registered in the input SRL, the input signal is provided to the logic 12. The input SRL's 18 are also connected to form a serial-in, parallel-out shift register in which a signal pattern is serially shifted into the input SRL's 18, and then into the logic 12. The output SRL's 20 each receive a respective output signal from the logic 12, register the output signal and provide it to a respective one of the output cells 16 to which the SRL is connected. The output SRL's 20 are also connected to form a shift register that can shift in a plurality of logic signals provided by the logic 12 and then serially shift those signals out. The chip 10 also has a connection between the input SRL's 18 and the output SRL's 20, illustrated by signal path 22, which effectively connects the input and output SRL's to form a single shift register.

In the architecture of the chip 10, an input signal pad 24 is connected by signal path 25 to the serial-in input of the serial shift register comprising the input and output SRL's; the serially-shifted output of the shift register is taken through the signal pad 26, connected through the signal path 27 to the serial output of the register.

As thus described, the shift register comprising the elements 24, 25, 18, 22, 20, 27, and 26, supports, in addition to the function of input and output signal registration, the ability to test the logic 12 just after manufacture of the chip 10. The test procedure involves, first, serially shifting a known signal pattern into the serially-connected input and output SRL's through the input signal pad 24, and observing the output through the signal pad 26. This validates the structure and operation of the input and output SRL's. Next, known patterns of signals are shifted serially into the input SRL's 18 and in parallel therefrom to the logic 12. In response to the successive patterns of signals, the logic 12 generates output signals which are provided to the output SRL's 20. Each set of logic output signals which is parallel loaded into the output SRL's 20 from the logic 12 is serially shifted out through the pad 26. In this manner, virtually all of the operational states of logic 12 can be tested. This technique of testing is referred to as "boundary scanning" because the input and output SRL's are located adjacent the physical and functional boundaries of the logic 12 and are structured to sequentially stimulate the logic 12 with a succession of determinable input signal patterns.

A significant limitation on the prior art implementation of boundary scan testing is that it cannot efficiently and effectively test the input and output cells of a micro circuit such as the chip 10. To understand this limitation, consider the input cell 30, which is representative of all of the plurality of input cells 14, and the output cell 34, representative of all of the output cells 16. Input cell 30 consists of the metalized signal pad 31 which is connected to the signal input of an input buffer located in the area of the chip 10 indicated by reference numeral 32. The output of the input buffer 32 is connected, in turn, to the input SRL 33. As is known, there may be hundreds of input cells, each including a metalized input signal pad having dimensions which prevent signal activation of the pads by, for example, a contact probe. Similarly, the output cell 34 consists of an output buffer 35 having an input and an output, with the output of the buffer 35 being connected to the metalized output signal pad 36. The input of the buffer 35 is connected to the output of a respective SRL 37 of the plurality 20. As with the input cells, the output signal pad of the output cells 16 are too small and too numerous to effectively test by contact signal probing.

While input and output testing of the input cells 14 and output cells 16 can be conducted after the micro circuit chip 10 is mounted in a chip carrier or package having pins through which signals can be inserted or received by conventional carrier means, postponing such testing until this stage of fabrication significantly increases the manufacturing costs of such chips. Now, if input and output testing indicate malfunction of input or output cells, the defective circuit represents a significant cost in fabrication and assembly.

Therefore, an urgent need exists to provide the capability of testing input and output cells after microcircuit fabrication, but prior to the portion of the manufacturing process in which the chips are packaged.

SUMMARY OF THE INVENTION

The invention is based upon the critical observation by the inventor that input and output cell testing can be effectively conducted by utilizing already-existing connections between input and output SRL's and input and output cells. To these existing structures and interconnections, the inventor has added provision for scanning signals into the input cell signal pads from no more than two points on the chip. These signals are conducted to the input SRL's through the input cell buffers and examined by serial shifting out of the SRL's. Similarly, the output cells are tested by shifting a known signal pattern to the output SRL's. The pattern is scanned through the output SRL's and the responses of the output cells to the scan pattern are examined, in sequence, by way of a single signal test path.

More specifically, the invention is practiced in a microcircuit device which includes a plurality of input cells, a plurality of output cells, a plurality of serially-connected first boundary scan cells, and a plurality of serially-connected second boundary scan cells. Each input cell includes an input buffer and an input signal pad connected to the input of the input buffer. Each output cell includes an output buffer and an output signal pad connected to the output of the output buffer. Each of the plurality of first boundary scan cells is connected to receive the output of the input buffer of the respective one of the input cells or the output of respective one of the other first boundary scan cells and each of the plurality of second boundary scan cells is connected to provide the input of the output buffer of a respective one to the output cells. The microcircuit device further include a signal path connecting the first boundary scan cells to the second boundary scan cells for serially shifting a pattern of signals into and through the second boundary scan cells.

The invention is an improvement for signal path scanning of the input and output cells of the micro circuit. In this regard, the invention includes first and second input stimulus buses and an input signal pad test bus. For each input cell, the invention further includes a gate circuit having an output connected to the input signal pad of the input cell, a signal output, and a control input connected to the input signal pad test bus. The gate circuit connects its signal input to its output in response to an input signal pad test signal on the input signal pad test bus. In the invention, the signal inputs of the gate circuits are connected alternately to the first and second input stimulus buses.

For output testing, the invention includes an output signal path test bus, an output signal pad signal bus, and, for each of the output signals, a gate/signal circuit combination. Each gate/signal circuit combination includes a gate circuit having an output connected to the output signal pad signal bus, a signal input connected to the output signal pad of a respective output cell, and a control input. The gate circuit connects its signal input to its output in response to an output signal pad test control signal on its control input. The signal circuit includes connections to the output signal pad test bus, to the secondary boundary scan cells, and to the gate circuit control input and generates the output signal pad test signal in response to the conjunction of a predetermined output pad scan test pattern serially shifted through the second boundary scan cells and an output signal pad test signal on the output signal pad test bus.

The primary objective of this invention is the provision of a structure that supports scan-testing of the the input and output cells of the microcircuit with a minimum of logic devoted solely to such scan-testing.

A significant advantage of the invention lies in the provision of a structure which supports input and output cell scan-testing of a microcircuit's die bonding pads, prior to microcircuit assembly, without hardware probe contact to each and every die bond signal pad.

These and other objects and advantages of this invention will become evident when the following detailed description is read with reference to the below-described drawings.

DESCRIPTION OF THE PREFERRED EMBODIMENT

Figure 1:
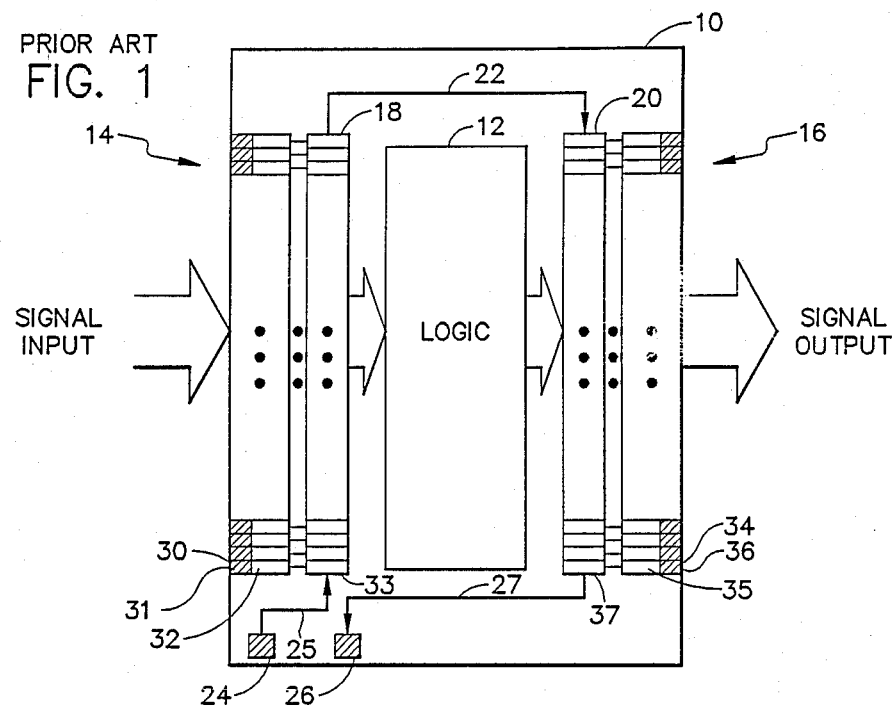
FIG. 1 illustrates prior art boundary scan testing of microcircuit logic.
Figure 2:
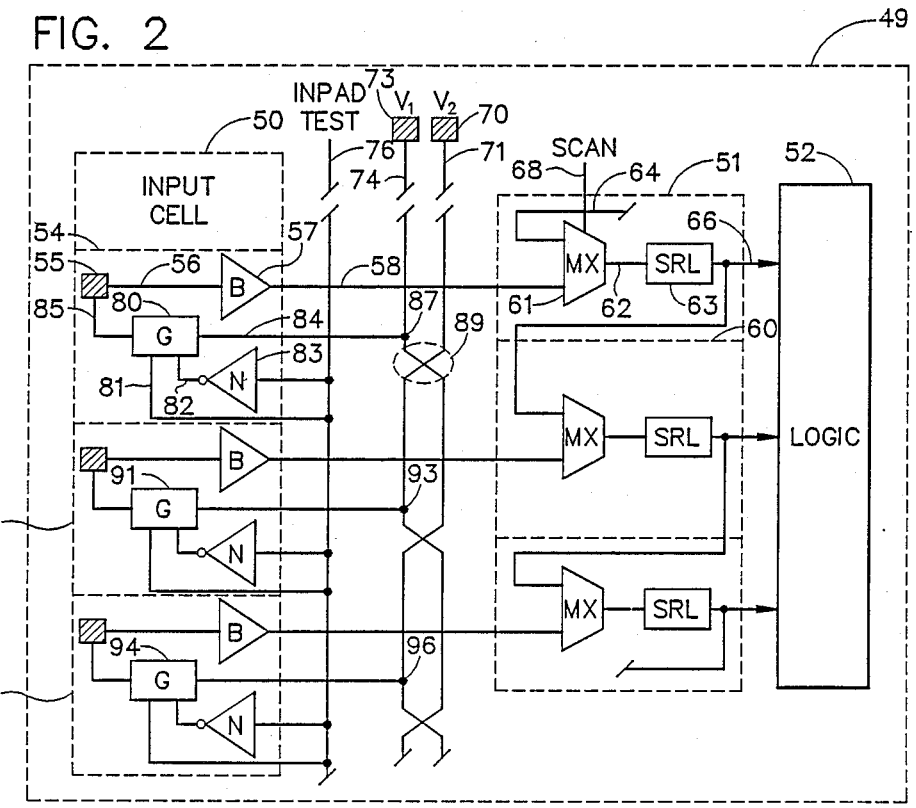
FIG. 2 illustrates an input cell structure which supports scan testing of the die bond pads of the input cells of a microcircuit such as that illustrated in FIG. 1.

FIG. 2 illustrates the structure of the invention which supports input cell signal pad testing. In FIG. 2, a micro circuit 49 has an array of input cells 50, a plurality of input boundary scan cells 51, and micro circuit logic 52. It is asserted that the input cells 50, input boundary scan cells 51, and logc 52 are connected for boundary scan testing and normal operation of the logic 52 as described above with reference to FIG. 1.

For a more detailed understanding, each of the cells 50 has the structure illustrated in the cell 54. In this regard, each cell includes an input signal pad (also referred to as a "die bonding pad") 55 having a signal connection 56 to the input of a buffer 57. The buffer 57 has a signal output illustrated by signal path 58, which is connected to a respective cell 60 of the plurality of input boundary scan cells 51. The cell 60 is representative of all of the input boundary scan cells 51 and includes multiplexer 61 whose output 62 is connected to the input of an SRL 63. The second input 64 to the multiplexer 61 is from the output 64 of the SRL in the input boundary cell immediately preceding the cell 60. The output 66 of the SRL 63 is connected both to the logic 52 and to the multiplexer of the next input boundary cell in the sequence following the cell 60. As thus far described, the signal connection from the pad 55 through the input boundary cells 51 to the logic 52 corresponds with the prior art illustrated in FIG. 1.

The improvement which the inventor has brought to the prior art of FIG. 1 lies in the provision of a means for providing a scan test signal to the input signal pad of each of the input cells. This improvement includes a first signal pad 70 connected to provide a voltage signal to a first stimulus bus 71 and a second signal pad 73 connected to provide a second voltage to a second input stimulus bus 74. An input signal pad test bus 76 is provided in the micro circuit 49 for conduction of an input pad test signal (INPAD TEST).

Further relating the improvement, each of the input cells 50 has a means for connecting an input stimulus signal from one of the two buses 71 or 74 to the signal pad of the input cell in response to activation of the INPAD TEST signal on the bus 76. This provision is illustrated in the input cell 54 by the transfer gate (G) 80. Assuming that the microcircuit 49 includes Bi-CMOS logic, the best mode for practicing this invention requires that the gate 80 be a conventional CMOS transmission gate. Such gates are amply described in the prior art, one such description being found at page 239 of MICROELECTRONICS, Second Edition, 1987, by J. Millman et al. The gate 80 receives a pair of control signals on input 81 and 82, both connected to the bus 76. Any signal on the bus 76 will be provided to the first control input of the gate 80, while its complement will be provided through the inverter 83 to the second control input of the gate 80. As is known, when the signal on the bus 76 has a (CMOS) digital value of 1, the positive control input will have a value of 1, the complementary control input will have a value of 0, and the voltage on the input 84 of the gate 80 will be provided to the output 85 of the gate. This set of conditions describes the "one" state of the gate 80. The "off" state of the gate obtains when the (CMOS) digital value of the signal on the bus 76 is 0. In this case, the gate 80 does not transmit and presents a high-impedance aspect at its output.

In the invention, the positive control is provided to the gate 80 by way of the signal line 81, while the complementary control is provided through the inverter 83 to the signal line 82. In FIG. 2, the input of the gate 80 is connected at node 87 to the input stimulus bus 74. The output of the gate 80 is connected to the signal pad 55. Thus, when the signal INPAD TEST =1, the signal on the stimulus bus 74 is transmitted through the gate 80 to the signal path 55 and then to the SRL 63 by way of the signal pads 55, 56, 57, 58, 61, and 62.

In the invention, the gate inputs of the input cells 50 are connected alternately to the stimulus buses 71 and 74. In this regard, as already described, the gate 80 is connected, at its input 84, to the stimulus bus 74. Next, in the input cell 92, the input of the gate 91 is connected at the node 93 to the stimulus bus 71, while the input of the gate 94 in the input cell 95 is connected at node 96 to the stimulus bus 74. In this manner, the signal inputs of the gates of the input cells 50 are connected alternately to the input stimulus buses 71 and 74.

In operation, a scan test of the signal pads of the input cells 50 is conducted by activating the INPAD TEST signal on the bus 76, applying a first stimulus voltage to the bus 71, and applying a second stimulus voltage to the bus 74. Preferably, the pads 70 and 73 are connected to precision voltage sources to test response of the input cells to values of VIH and VIL. For example, VIH would be set to the minimum level of input signal voltage which, when applied to the signal pad of an input cell, should cause a digital 1 to be registered in the input boundary scan cell connected to the input cell's buffer. VIL would be set for the maximum voltage level which would cause a 0 to be registered. Since the precision sources are external to the microcircuit, VIH and VIL can be provided in any desired combination of range and terminal characteristics.

In operation, then, the desired signal levels are connected to the input pads 70 and 73 and the INPAD TEST signal is set to a 1. The SCAN signal applied to multiplexers in the input boundary scan cells 51 for boundary scanning is inactivated, thereby connecting the output of each input cell buffer to its respective input boundary cell SRL. Then, the INPAD TEST signal is deactivated, and the SCAN signal is activated causing the input scan cell multiplexers to select outputs from the input scan SRL's. Now, the input boundary scan cells are conventionally serially-shifted through their multiplexers to provide the pattern of input signals stored in the input boundary cells. The serial shifting is done conventionally by way of, for example, serially-connected output boundary cells (not illustrated) in the microcircuit 49.

Inspection of the input signal pattern shifted out of the input boundary cells 51 will reveal the operation of the input cells 50. Relatedly, it would be expected that the output pattern would display alternating 1's and 0's since the input cells were connected alternately to the stimulus buses 71 and 74. Any break in this alternation, for example adjacent 0's or adjacent 1's, would effectively reveal either a short circuit between two adjacent input cells, or the failure of one of the input cells to respond correctly to its input stimulus voltage.

It will be appreciated that the input signal pad scanning capacity carried in the structure of FIG. 2 enjoys maximum utilization of in-place boundary scanning logic, while requiring only the provision of two test pads, 70 and 73, three buses, 71, 74, and 76, and, for each input cell, the transmission gate, signal path, converter combination illustrated and described above. It will be further appreciated that this basic complement of parts provides for respective dynamic testing of the microcircuit input cells without the need for probe contact to each of the individual input cell pads.

Figure 3:
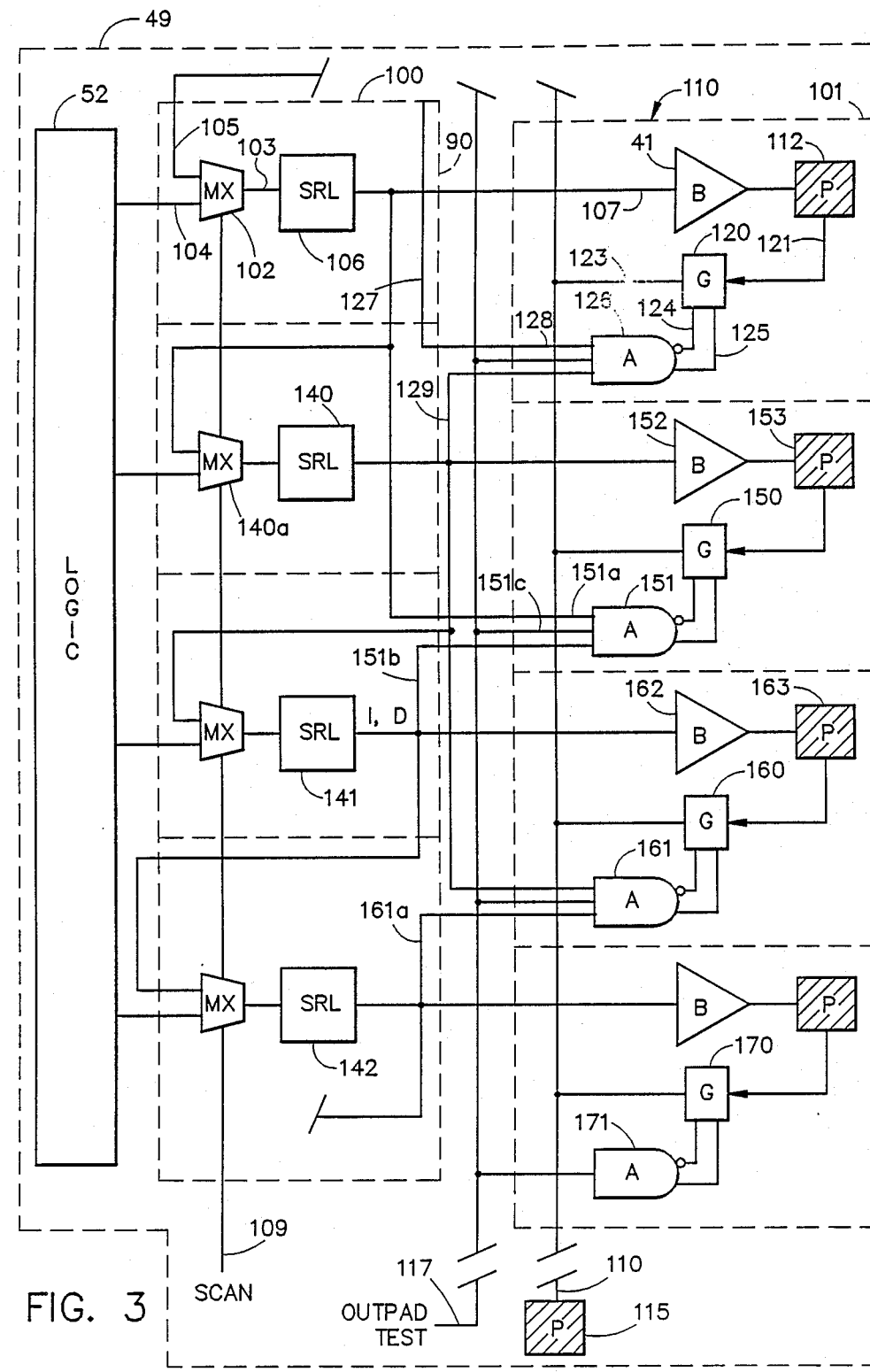
FIG. 3 illustrates the structure of output cells supporting scan testing of output cell signal die bond pads according to the invention.

Output cell pad scanning is embodied in the structure of FIG. 3. In FIG. 3, the principal signal outputs of the logic 52 of the micro circuit 49 are connected through the output boundary scan cells 100 to output cells 101. For example, the output cell 110 is connected to the output of an output boundary scan cell 99 consisting of a multiplexer 102 and a SRL 106. The multiplexer 102 has an output 103 connected to the input of SRL 106, and two inputs 104 and 105. The input 104 is connected to a principal output of the logic 52, while the input 105 is connected to the output of the SRL in the output boundary cell immediately preceding the scan cell 99. The output of the SRL 106 is connected by signal line 107 to the output cell 110.

The output cell 110 is representative of all of the output cells 101, and includes an output buffer 111 and output signal pad 112. The input of the buffer 111 is connected to the output of the SRL 106 by the signal line 107. The output of the buffer 111 is connected to the signal pad 112. In normal, non-test operation of the logic 52, an output of the logic 52 is connected by way of the signal path 104, 102, 103, 106, 107, and 41 to the output signal pad 112. When the output boundary scan cells 100 are operated in the scan mode, the SCAN signal on signal line 109 is activated, causing each of the SRL's of the cells 100 to receive the input of the cell above it through its connected multiplexer. For example, in the scan mode, the input to the SRL 106 is provided from the output boundary cell immediately above the cell containing the SRL 106 on the signal line 105 through the multiplexer 102. In this mode, the output of the SRL 106 is provided to the SRL 140 in the output boundary scan cell immediately below that containing the SRL 106 through the multiplexer 140a. As described above in connection with the prior art, when the output boundary scan cells 100 are operated in the scan mode, their contents are shifted serially through an output scan signal pad (not shown) connected to the bottom-most SRL (not shown) of the output scan cells 100.

Output pad scanning according to the invention includes provision of an output pad signal pad 115 connected to an output signal pad signal bus 110. In addition, an OUTPAD TEST signal is provided on an output signal pad test bus 117. The invention further includes, for each of the output cells 101, a gate circuit including a CMOS transfer gate and signal circuit in the form of an AND gate having uncomplemented and complemented outputs. The gate and signal circuits of the output cells can be understood with reference to output cell 110 wherein an output gate 120 has its two control inputs connected to the positive and complementary outputs of 3-input AND gate 126. The positive output of the AND gate is fed on signal line 125 to the positive control input of the gate 120, while the complementary output of the gate 126 is fed to the complementary control input of the gate 120. The gate 120 operates, as described above, by transmitting the signal present on its input to its output when a 1 is present on its positive control signal input and a 0 on its complementary control signal input. Otherwise, the gate is off, with its output appearing as a high impedance.

As shown in FIG. 3, the input of the transfer gate 120 is connected on signal path 121 to the pad 112, while the output of the transfer gate 120 is connected on the signal path 123 to the bus 116. The AND gate 126 has 3 inputs 127, 128, and 129. The first input 127 is connected to the output of the SRL in the output scan cell immediately preceding the output scan cell 99. The second input 128 is connected to the bus 117, while the third input is taken from the output of the SRL 140, immediately succeeding the scan cell 99 in the serially-connected output scan cells 100.

In operation, the output scan cells are operated in a scanning mode by application of the SCAN signal to the signal 109, while a specific pattern is shifted through the output boundary scan cells 100. This pattern is of the form:

000 ... 0001X100000 ... 0000

Where X may be 1 or 0 depending on whether high or low logic values are to be tested. This pattern is serially shifted through the output scan cells so that the 3 significant bits -1X1-, together with the OUTPAD TEST signal, sequentially activate the gates of the output cells 101. For example, assume that the 3 significant bits of the pattern are in the SRL's 106, 140, and 141, and that the OUTPAD TEST signal is activated. The 1's in the SRL's 106 and 141 are fed, respectively, to the inputs 151a and 151b of the AND gate 151. The OUTPAD TEST signal is fed to input 151c, thereby activating all of the input of the AND gate 151. This activates the positive-sense output and deactivates the complementary output of the gate, which turns the transmission gate 150 on. Now, the X bit stored in SRL 140 is fed out onto the bus 116 through the path buffer 152, pad 153, gate 150. The signal is tested at the pad 115; if equal to X, the gate is assumed to be working correctly.

Next, the pattern is shifted through the output scan cells one bit position in the direction which places the significant bits -1X1- in SRL's 140, 141, and 142, respectively. With the OUTPAD TEST signal still active, the AND gate 161 is activated by the 1 in SRL 140, the 1 in SRL 142, and the OUTPAD TEST signal. This turns on the transfer gate 160, thereby enabling the X in SRL 141 to be conducted from SRL 141 to the bus 116 through the buffer 162, pad 163, and gate 160. In this manner, the bit pattern is serially shifted through the output scan cells, effectively scanning the X bit through the output cell pads, in sequence, onto the bus 116.

While any output cell gate circuit is activated, no other can operate because all of the AND gates, save that of the activated output cell, are disabled by provision of at least one zero. For example, assuming that the 1X1 bits are in SRL's 106, 140, and 141, the AND gate 151 is activated. However, the 0 provided on signal line 127, and the 0 on signal line 161a keep the gates 126 and 160 inactive, thereby preventing their connected transfer gates from being turned on. All other AND gates at this time have two zeroes input, which will keep them turned off. Thus, the signal value at the output pad signal pad 115 represents the response only of the cell where the X is presently positioned.

Figure 4:
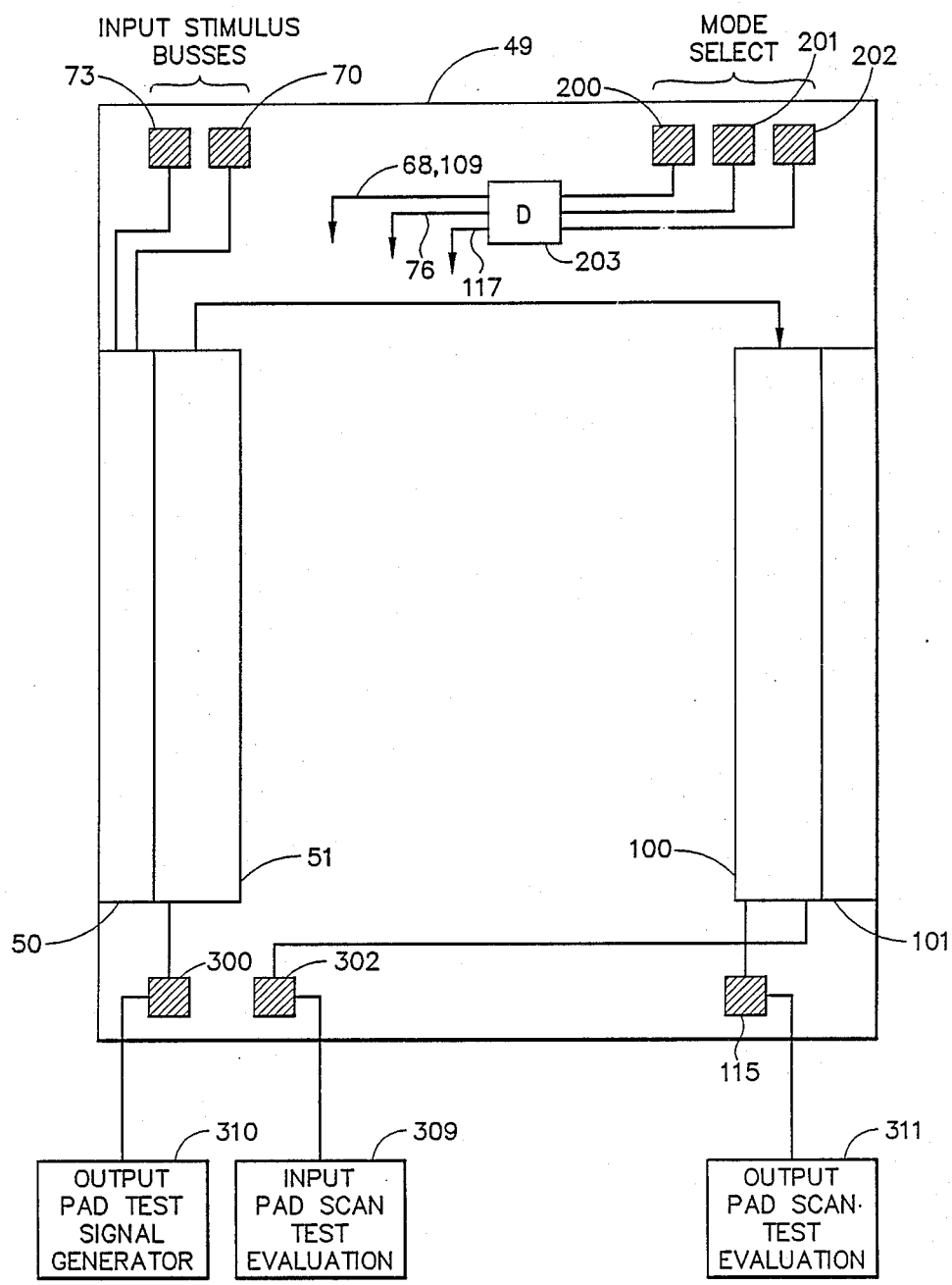
FIG. 4 illustrates a microcircuit layout providing control signal sources for the structures of FIGS. 2 and 3.

The derivation of the SCAN, INPAD TEST, and OUTPAD TEST signals is illustrated in FIG. 4. As shown, the microcircuit 49 includes a standard decoder 203, having eight possible states determined by the signals applied to mode select pads 200, 201, and 202. These three states result in generation of, respectively, the SCAN, INPAD TEST, and OUTPAD TEST signals which are used as described above. The decoder 203 is conventional in all respects and is equivalent to decoders commonly found in VSLIC circuitry to establish an operational mode.

FIG. 4 also illustrates basic test configurations for input and output pad scan testing. For input pad scan testing, the two precision voltage signals are applied to the input stimulus buses through pads 73 and 70, the INPAD TEST signal is generated by operation of the decoder 203, and the input cell responses are captured in the input scan cells 51 and shifted serially through the output scan cells 100 out through the signal pad 302 (equivalent to pad 26 in FIG. 1). Input pad scan test evaluation is conducted by an apparatus 309, which receives the pattern of input cell responses through the pad 302, analyzes the pattern, and validates input cell operation.

Output pad scan testing is done by initially generating the signal pattern with the three significant bits -1X1- from an output pad test signal generator 310, and serially shifting the pattern through the input scan pad 300 (equivalent to the pad 24 in FIG. 1) and the input scan cells 50 to the output scan cells 100. Then, the OUTPAD TEST signal is activated while the signal pattern is serially shifted through the output scan cells. As the pattern is shifted through the output scan cells, cell by cell, the output cells 101 are sequentially activated, resulting in the provision of a sequence of output cell response signals being conducted to the signal pad 115. The output cell response signal sequence is provided to an output pad scan test apparatus for evaluation and validation of output cell operation.

While I have described preferred embodiments for my non-contact I/O signal pad scanning structure for VSLICs, it should be understood that modifications, variations, elaborations, and adaptations thereof will occur to the skilled artisan. Therefore, the protection afforded my invention should only be limited in accordance with the scope of the following claims.

I claim:

1. In a microcircuit device which includes a plurality of input cells, a plurality of output cells, a plurality of serially-connected first boundary scan cells, and a plurality of serially-connected second boundary scan cells, each input cell including an input buffer and an input signal pad connected to the input of the input buffer, each output cell including an output buffer and an output signal pad connected to the output of the output buffer, each of the plurality of first boundary scan cells connected to receive the output of the input buffer of a respective one of said input cells or the output of a respective one of said first boundary scan cells, and each of the plurality of second boundary scan cells connected to provide the input of the output buffer of a respective one of said output cells, said microcircuit device further including means connecting said first boundary scan cells to said second boundary scan cells for serially shifting a pattern of signals into and through said second boundary scan cells, an improvement for signal pad scanning of said input and output cells, wherein said improvement comprises:
   a first input stimulus bus;
   a second input stimulus bus;
   for each of said input cells, a gate circuit having an output connected to the input signal pad of said input cell, a signal input, and a control input connected to said input signal pad test bus, said gate circuit connecting its signal input to its output in response to an input signal pad test signal on said input signal pad test bus;
   the signal inputs of said gate circuits being connected alternately to said first and second input stimulus busses;
   an output signal pad test bus;
   an output signal pad signal bus; and,
   for each said output cell:
   a gate circuit having an output connected to said output signal pad signal bus, a signal input connected to the output signal pad of said output cell, and a control input, said gate circuit connecting its signal input to its output in response to an output signal pad test control signal on said control input; and,
   a signal circuit means connected to said output signal pad test bus, said second boundary scan cells, and to said gate circuit control input for generating said output signal pad test control signal in response to the conjunction of a predetermined test pattern serially shifted through said second boundary scan cells and an output pad test signal on said output pad test bus.

2. In a microcircuit device including a plurality of input cells, each input cell having an input buffer and a pad connected to the input of said input buffer, functional logic, and a plurality of input latches, each of said input latches connected to the output of a respective input buffer and to said functional logic for the purpose of registering an input signal provided from said input buffer to said functional logic, said plurality of input latches being connected for parallel-in, serial-out shifting of signals received from said input cells, an improvement for signal scanning of said input cells, said improvement comprising:
   a first stimulus bus for conducting a first input level test voltage;
   a second stimulus bus for conducting a second input level test voltage;
   means for providing an input pad test signal to said input cells; and,
   for each of said input cells, a gate circuit having an output connected to the input pad of said input cell, a signal input, and a control input connected to said means, said gate circuit signal input being connected to said gate circuit output in response to said input pad test signal;
   the signal inputs of said gate circuits being connected alternately to said first and second stimulus busses.

3. In a microcircuit device including a plurality of output cells, each output cell having an output buffer and a pad connected to the output of the output buffer, functional logic, and a plurality of output latches, each of said output latches connected to the input of a respective output buffer for the purpose of registering an output signal provided from said functional logic to said output buffer, said plurality of output latches connected for serial shifting of patterns of signals, the signals of any pattern of signals serially shifted in said plurality of output latches being provided in parallel to the output buffers of said plurality of output cells, an improvement for signal scanning of said output cells, said improvement comprising:
   means for providing an output pad test signal to said output cells;
   an output pad signal bus; and,
   for each of said output cells:
   a gate circuit having an output connected to said output pad signal bus, a signal input connected to the output pad of said output cell, and a control input, said gate circuit connecting its signal input to its output in response to an output pad test control signal on said control input; and,
   a signal circuit connected to said means, to said output latches, and to said gate circuit control input for generating said output pad test control signal in response to the conjunction of a predetermined scan test patttern serially shifted through said output latches and said output pad test signal.

4. A method for testing the input cells of an integrated circuit in which a plurality of input cells are connected to a plurality of scan cells for parallel-in, serial-out shifting of signals from said input cells through said scan cells, each input cell including an input pad, and an input buffer, said input buffer having an input and an output, said input connected to said input pad and said output connected to the input of a respective one of said scan cells, said method comprising the steps of:
   connecting a first voltage to first ones of said input cell pads;
   connecting a second voltage to second ones of said input cell pads, said second ones of said input cells alternating with said first ones of said input cells;
   parallel shifting signals produced by said input cell buffers in response to said connecting steps into said scan cells;
   serially shifting said signals through said scan cells to an output test point on said integrated circuit; and evaluating said signals at said output test point to validate operation of said input cells.

5. A method for testing the output cells of an integrated circuit in which a plurality of output cells are connected to a plurality of scan cells, said scan cells being serially interconnected for scanning of a signal pattern through said scan cells and being connected in parallel to said output cells, each of said output cells having an output buffer with an input connected to the output of a respective one of said scan cells and an output, an output pad connected to said output, and a gate means connected to said scan cells for selectively connecting said output pad to an output test point in said integrated circuit, comprising the steps of:

serially shifting a signal pattern into said scan cells, said signal pattern activating only one of said gate means at each serial shift location in said scan cells;
iteratively:
serially shifting said signal pattern in said scan cells by one scan cell;
activating a respective gate means; and conducting an output signal produced by the buffer of the output cell containing said respective gate means to said output test point;
evaluating a sequence of output cell signals produced by iteratively performing said serially shifting, activating, and conducting steps to validate operation of said output cells.

* * * * *

UNITED STATES PATENT AND TRADEMARK OFFICE
CERTIFICATE OF CORRECTION

PATENT NO.   :   4,875,003
DATED        :   October 17, 1989
INVENTOR(S)  :   Gary R. Burke It is certified that error appears in the above-identified patent and that said Letters Patent is hereby corrected as shown below:

Claim 5 as to structure only beginning on Line 1 Column 12 as follows:

serially shifting a signal pattern into said scan cells, said signal pattern activating only one of said gate means at each serial shift location in said scan cells;

iteratively:

serially shifting said signal pattern in said scan cells by one scan cell;
activating a respective gate means; and
conducting an output signal produced by the buffer of the output cell containing said respective gate means to said output test point;

evaluating a sequence of output cell signals produced by iteratively performing said serially shifting, activating, and conducting steps to validate operation of said output cells.

Signed and Sealed this

Eighteenth Day of September, 1990

*Attest:*

HARRY F. MANBECK, JR.

*Attesting Officer*           *Commissioner of Patents and Trademarks*